United States Patent
Chakravorty et al.

[11] Patent Number: 5,892,290
[45] Date of Patent: Apr. 6, 1999

[54] HIGHLY RELIABLE AND PLANAR BALL GRID ARRAY PACKAGE

[75] Inventors: Kishore Kumar Chakravorty; Thiam Beng Lim, both of Singapore, Singapore

[73] Assignee: Institute of Microelectronics, Singapore

[21] Appl. No.: 735,791

[22] Filed: Oct. 21, 1996

Related U.S. Application Data

[62] Division of Ser. No. 582,745, Jan. 4, 1996.

[30] Foreign Application Priority Data

Oct. 28, 1995 [SG] Singapore .................. 9501669-7

[51] Int. Cl.⁶ .................. H01L 23/48; H01L 23/52; H01L 29/40
[52] U.S. Cl. .................................. 257/786; 257/787
[58] Field of Search .................. 257/787, 780, 257/781, 786, 779

[56] References Cited

U.S. PATENT DOCUMENTS

| | | | |
|---|---|---|---|
| 5,355,283 | 10/1994 | Marrs et al. | 257/787 |
| 5,506,756 | 4/1996 | Haley | 257/786 |
| 5,612,576 | 3/1997 | Wilson et al. | 257/787 |

Primary Examiner—Mahshid D. Saadat
Assistant Examiner—S. V. Clark
Attorney, Agent, or Firm—Meltzer, Lippe, Goldstein et al.

[57] ABSTRACT

The invention is directed to a BGA package and method for making a BGA package in which warpage, delamination and package cracking are reduced. The inventive BGA package has a die attached to one surface of a substrate. The substrate may terminate at its opposite surface in an array of connection ports which is an integral part of the substrate. Alternatively, the array of connection ports is attached to the opposite surface of the substrate. The connection ports may be attach pads attached to the opposite surface of the substrate and solder balls or metal bumps attached to the attach pads. A matrix of molding compound fully encapsulates the substrate, die and the array of connection ports. The matrix molding compound is then ground to provide a flat surface and to expose portions of the connection ports. Another array of connection ports, such as an array of solder balls or metal bumps, may be attached to the existing array of connection ports. In another embodiment, retracting pins are positioned over the solder attach pads. The mold compound fully encapsulates the substrate, die, solder attach pads and portions of the retracting pins. Removing the retracting pins, after the encapsulation, exposes portions of the solder attach pads so that solder balls or metal bumps are attached to the exposed portions of the solder attach pads.

16 Claims, 3 Drawing Sheets

HIGHLY RELIABLE AND PLANAR BALL GRID ARRAY PACKAGE

This application is a division of application Ser. No. 08/582,745, filed Jan. 4, 1996, (pending).

RELATED APPLICATION

The subject matter of the present application is related to the subject matter of U.S. Pat. application Ser. No. 08/582, 745, entitled "Apparatus For Dispensing Fluid In An Array Pattern", filed on even date herewith for Sarvotham M. BHANDARKAR, Kishore Kumar CHAKRAVORTY, Tai Chong CHAI and Jian Hua WU. Both this application and the above-noted related application are assigned to the same assignee. The contents of the above-noted related application are incorporated herein by reference.

1. Field of the Invention

The present invention relates to a highly reliable and planar ball grid array (BGA) package which is fully encapsulated and has solder regions acting as connection ports.

2. Background of the Invention

Ball grid array (BGA) packages, which connect to printed circuit boards (PCBs) using balls instead of pins or leads, are an alternative to existing peripheral-leaded surface mounted packages which require fine lead pitch for high I/O count packages.

For low I/O count devices (30–150 pins), fine pitch leaded packages offer body sizes and profiles that are comparable to currently offered BGA packages. However, BGAs are superior to fine pitch leaded packages for high pin count devices (208 pins or more). Additionally, the assembly process margins and yields with BGAs are substantially superior to fine pitch leaded packages.

BGA packages offer other advantages over the peripheral-leaded counterparts. For example, a BGA package has a large ball (i.e., lead) pitch of 1.27–1.5 mm as opposed to state of the art 0.3 mm lead pitch for a peripheral leaded QFP, (Quad Flat Pack). This large pitch enables good adaptability to existing SMT (Surface Mount Technology) manufacturing processes which use solder paste screen printing, component placement, then mass reflow.

For surface mount attachments of BGA packages, the solder deposit areas are larger and separated at larger pitches as compared to conventional SMT. This simplifies stencil solder printing. A larger and circular shaped opening in the stencil alleviates the problem often encountered in the conventional SMT of difficulties in forcing solder through narrow rectangular openings in the stencil.

The relatively large lead spacing of BGA packages also reduces placement tolerances that are critical in 0.5 or 0.4 mm pitch QFP packages. Thus, BGA packages are considered superior both for distribution of large I/Os (Inputs/outputs) on a small package footprint as well as ease in surface mount assembly.

Ease in assembly is exemplified by the fact that the surface tension of the molten solder ball provides a self-centering mechanism. A placement accuracy of 124 μm between the land and the solder ball is often sufficient. This can be easily achieved by currently available mounting machines.

FIG. 1 illustrates a conventional ball grid array (BGA) package 10 known as "OMPAC" or Overmolded Plastic BGA package developed by Motorola. The overmolded plastic BGA package 10 has an organic substrate 15, such as BT resin based (Bismaleimide Triazine). A die 20 (i.e. an integrated circuit (IC) chip) is attached to the substrate 15 using a die attach adhesive 22.

The substrate 15 contains embedded multiple horizontal layers of metal conductors (not shown) connected by vertical conductors (not shown). The die 20 is positioned over the top surface 25 of the substrate 15. I/Os of the die 20 are connected to these embedded conductors by bonding wires 30. The bonding wires 30 are bonded to die bonding pads 32 on the die 20 and bonded to bond pad sites 35 on the top surface 25 of the substrate 15. The bonding wires 30 are attached as follows. A ball is formed at one end of a bonding wire 30 which is typically made of gold or aluminum. This ball is then attached by thermocompression jointly employing ultrasonic vibrations to the die bonding pad 32 on the die 20. A similar process is used to attach the bonding wires 30 to the bond pad sites 35 on the top surface 25 of the substrate 15. This process is done in the temperature range of 180° C. to 200° C., and typically at 180° C.

The I/Os of the die 20 are routed to the bottom surface 40 of the substrate 15 through the metal conductors embedded in the substrate 15. In addition, through going vias 45, and thermal vias 50 used for heat transfer, may also be formed between the top and lower surfaces 25, 40 of the substrate 15. The through going vias 45 may serve to relieve mechanical stress.

Solder balls 55 are attached to land sites 60 at the bottom surface 40 of the substrate 15 and function as the I/O pins of the plastic BGA package 10. These sites 60 are connected to the die 20 via the metal conductors embedded in the substrate 15. The top surface 25 of the package 10 is encapsulated or overmolded by an epoxy molding compound 65 using a transfer molding process. In its final form, the package 10 is soldered to a printed circuit board (not shown).

FIG. 2 shows a bottom view of the package 10 shown in FIG. 1. As shown in FIG. 2, the bottom surface 40 of the substrate 15 has an array of solder balls 55 connected thereto. The package 10 is mounted to a PCB (not shown) using a vapor-phase or infrared solder reflow process. In either of these reflow processes, solder paste is deposited on the PCB and the array of solder balls 55 of the package 10 is positioned over the solder on the printed circuit board. A heat treatment is carried out so that the solder balls 55 reflow and attach the package 10 to the PCB.

Several other variations of conventional plastic BGA packages have been developed. These variations include different package configurations, encapsulation approaches, and substrate types.

In spite of the advantages of the conventional plastic BGA packages over peripheral-leaded surface mounted packages, the conventional plastic BGA packages have many problems, such as warpage, delamination and cracking.

In conventional plastic BGA packages, warpage of the substrate occurs after the overmolding process. This warpage poses a problem in SMT placement and attachment of the solder ball joints. Unlike the ceramic BGA packages, BT substrates of plastic BGA packages are vulnerable to warpage due to their low stiffness. Overmolded structures, such as the conventional BGA package 10 shown in FIG. 1, have a mismatch in their CTE (Coefficients of Thermal Expansion) between the epoxy molding compound 65 and the substrate 15. The substrate 15, as mentioned above, is BT resin based, which has a CTE (z-direction) of $4.7 \times 10^{-5}$/°C. The die or chip 20 is formed of silicon and has a CTE of $2.6 \times 10^{-6}$/°C. This CTE or thermal mismatch creates interfacial stress as the overmolded structure is cooled to room temperature from elevated processing temperatures, such as during the die attach, wire bonding and overmolding processes.

The presence of the mold compound encapsulant 65 on only one side of the substrate 15 creates an unbalanced situation and leads to stress on the substrate 15. This causes warpage of about 140 microns for a 225 pins overmolded package. Warpage creates reliability concerns because it interferes with solder ball attachments and also impacts the integrity of other interfaces present in the package, such as the interface between the mold compound 65 and substrate 15.

In addition to warpage, delaminations occur between the overmold compound 65 and the substrate 15. The delaminations are caused by excessive interfacial and thermal stresses at the adjoining interface between the overmold compound 65 and the substrate 15. These residual thermal stresses may arise during both the manufacture and use of the package.

When molded, the entire package is at the mold temperature of approximately 180° C. Upon cooling to room temperature, mismatches in the coefficients of thermal expansion (CTE) for the mold compound 65 and the substrate 15 result in residual stresses at the interface of these two materials. Furthermore, during soldering of the package 10 to the main circuit board of an electronic device (i.e., to a PCB), the soldering temperature of about 235° C. creates additional thermal stresses at the interface between the substrate 15 and overmold compound 65. This is because the thermal expansion coefficients of the two materials are different. These interfacial stresses often lead to delaminations between the overmold compound 65 and the substrate 15. This is considered to be a primary failure mechanism in the overmolded BGA package 10.

Package cracking is another problem with the overmolded BGA package 10. Organic substrates and mold compounds absorb moisture from their environment, particularly for FR-4 type of substrates. When the packages are exposed to high temperatures, such as those involved in the solder reflow process (about 225° C.), package cracking occurs due to thermal mismatch and the evaporation of expanded super steam under solder reflow conditions.

In addition, the thermal mismatch and the evaporating moisture weaken the interfacial bonds (between the mold compound 65 and the substrate 15 or between the die 20 and the substrate 15) leading to delaminations. The expanding moisture aggravates the delaminations and at the same time imposes high pressure at the interfacial bonds, causing package cracking. To alleviate this problem, the overmolded BGA package 10 is baked to dry (so that moisture is removed), and packed in hermetic bags. This is costly and not always a practical solution.

As shown in FIG. 1, the overmolded BGA package 10 has only one of the six faces of the substrate 15 encapsulated by the mold compound 65. The epoxy resins of the substrate 15 material is typically FR-4 or BT-glass. Both of these materials exhibit high moisture absorption. In addition, epoxy resins may contain high levels of chloride ion contamination. The absorbed moisture in conjunction with the chloride ions lead to galvanic corrosion of conductors and therefore reduce reliability.

Accordingly, it is an object of the invention to provide a BGA package and method for making a BGA package in which warpage, delamination and package cracking are reduced.

SUMMARY OF THE INVENTION

The invention is directed to a BGA package and a method for making a BGA package in which warpage, delamination and package cracking are reduced.

In an illustrative embodiment, the inventive BGA package has a die attached to one surface of a substrate. A first array of connection ports is attached to an opposite surface of the substrate. Illustratively, the first array of connection ports may be attach pads, which may be solder attach pads, attached to the opposite surface of the substrate and solder balls or bumps attached to the attach pads. The solder balls or bumps may be deposited on the attach pads by electroplating or stencil printing. Alternatively, the substrate terminates with connection ports on its opposite surface, which are integral part of the substrate.

A matrix of molding compound fully encapsulates the substrate, die and portions of the first array of connection ports, which portions are near the substrate. The remaining portions of the connection ports are not encapsulated by the mold compound and are exposed. A second array of connection ports, which may be an array of solder/metal balls or bumps, is attached to the exposed portions of the first array of connection ports.

In a second embodiment, instead of having two arrays of connection ports, one array of connection ports, which may be an array of solder/metal balls or bumps, is attached to an array of attach pads which is formed on the surface of the substrate opposite the die. The mold compound matrix fully encapsulates the substrate, die, array of attach pads and the portions of the connection ports near the substrate, leaving exposed the remaining portions of the connection ports.

Conductors embedded in the substrate selectively connect I/Os of the die to the array of attach pads.

DETAILED DESCRIPTION OF THE INVENTION

The present invention is directed to a BGA package and a method for making a BGA package in which warpage, delamination and package cracking are reduced.

Figure 3A:
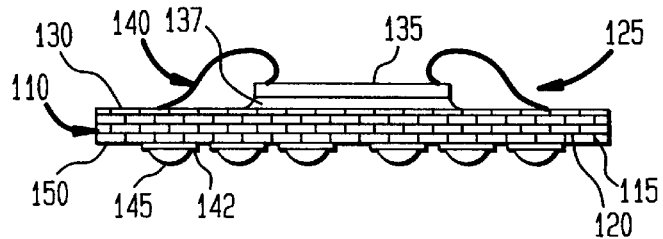
FIGS. 3a–3d illustrate a process for forming a BGA package according to one embodiment of the invention.

The starting point for the inventive method according to an illustrative embodiment is shown in FIG. 3a. A substrate 110 is formed having multiple layers of embedded horizontal metal conductors 115 which are interconnected by vertical conductors 120. Illustratively, the substrate 110 is made of BT or FR-4 and has a thickness of approximately 0.3 mm to 0.7 mm.

A die assembly 125 is formed on the top surface 130 of the substrate 110 using conventional means. The die assembly 125 comprises an IC chip (i.e. a die) 135 which is mechanically connected by a die attach adhesive 137 to the top surface of the substrate 110. The IC chip 135 is electrically connected to the substrate 110 by bonding wires 140.

By conventional means, an array of I/O connection ports is provided at the bottom surface 150 of the substrate 110. For example, an array of attach pads 142, which may be solder attach pads, is formed at the bottom surface 150 of the substrate 110. Alternatively, instead of forming an array of attach pads 142 at the bottom surface 150 of the substrate 110, the substrate 110 may be formed so that its bottom surface 150 has the array of attach pads 142 which is an integral part of the substrate 110. An array of connection ports, such as an solder balls 145 is attached to the array of attach pads 142 using conventional means.

Alternatively, instead of the array of solder balls 145, an array of metallized bumps (which are similar to the array of solder balls 145), may be deposited over the array of attach pads 142 by other processes, such as stencil printing, vapor solder paste, solder electroplating, etc. The array of attach pads 142 along with the array of solder balls 145 or the array of metallized bumps form connection ports of the IC. The solder (or metal) composition has to be selected such that it is able to withstand temperatures associated with subsequent fabrication processes, e.g., up to 180° C., without melting.

In addition to withstanding fabrication temperatures, the metallized bumps, which may be attached to the array of attach pads 142 in lieu of the array of solder balls 145, are of a material that interacts favorably (i.e., good melting and intermixing) with Pb/Sn type of solder material. Illustratively, the array of metallized bumps may be gold, copper/gold alloy or solder. This type of material is needed since a final array of solder balls or bumps (180 of FIG. 3d) will be attached over these metallized bumps in subsequent steps, as explained below.

For example, the metallized bumps may be solder bumps, which are formed on the array of attach pads 142 by conventional processes that are different from the conventional process for attaching the solder balls 145 (i.e., processes such as stencil printing, vapor solder paste, solder electroplating, etc). Thus, the array of attach pads 142 at the bottom surface 150 of the substrate 110 may have attached thereto an array of solder balls 145, an array of metal bumps or other connection ports.

The I/Os of the die 135 are routed to bottom surface 150 of the substrate 110 through the embedded horizontal metal conductors 115 and the vertical conductors 120. The vertical conductors 120 selectively interconnect the horizontal metal conductors 115 so that I/Os of the die 135 are selectively interconnected to the array of solder balls 145 (or metal bumps).

Figure 1:
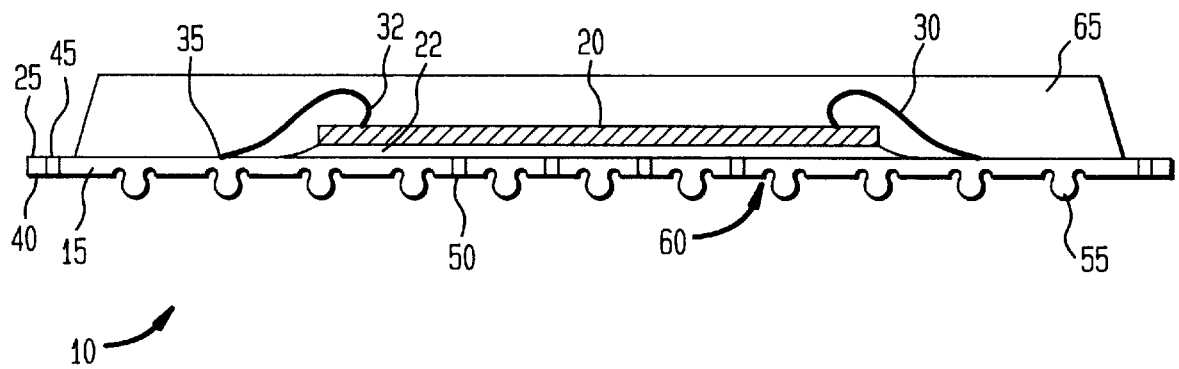
FIG. 1 is a conventional BGA package.
Figure 2:
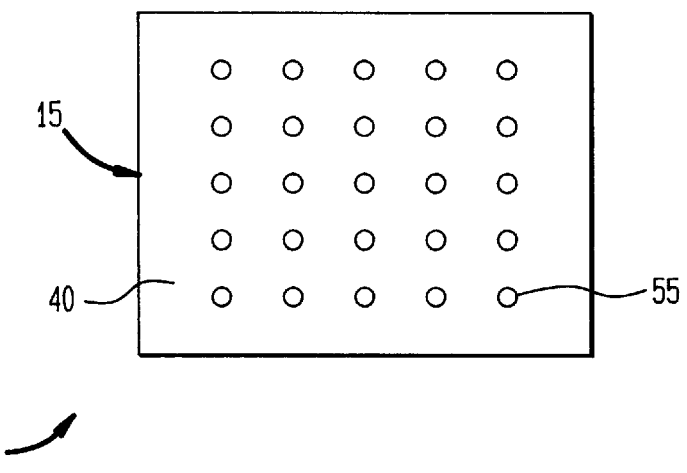
FIG. 2 is a bottom view of the conventional BGA package shown in FIG. 1.
Figure 3B:
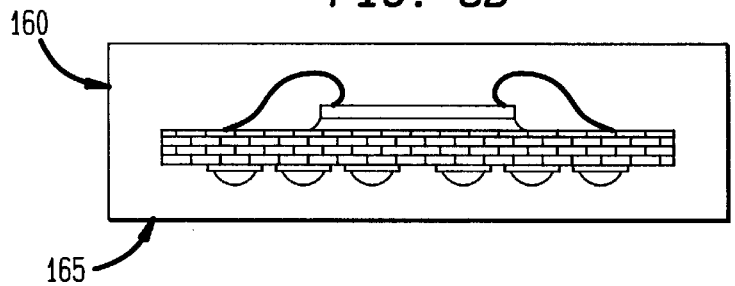

As shown in FIG. 3b, both the substrate 110 with the attached die assembly 125, and the array of solder balls 145 (or metal bumps) are encapsulated fully in a mold compound matrix 160. The mold compound matrix 160 may be similar to the mold compound 65 (FIG. 1) used in conventional overmold plastic packages. Illustratively, the mold compound matrix 160 is epoxy (novolak based), and molded at approximately 180° C. Fully encapsulating the BGA package, instead of only overmolding, balances stresses on the top and bottom surfaces 130, 150 of the substrate 110. As a result, warpage is significantly reduced.

Figure 3C:
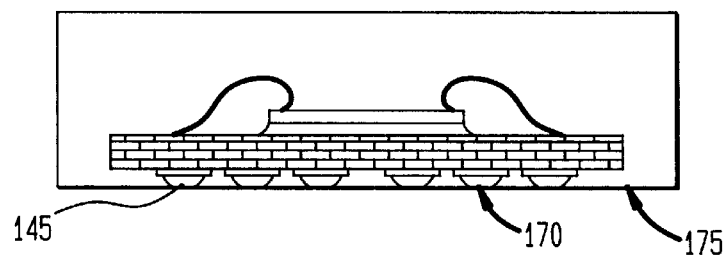

Next, as shown in FIG. 3c, the bottom surface 165 (FIG. 3b) of the mold compound matrix 160 is milled by grinding in order to expose the bottom metallic surfaces 170 of the array of solder balls 145 (or metal bumps). Grinding of molded parts is a routine operation in BGA package manufacturing. This grinding step also planarizes the bottom surface 175 of the package. That is, the grinding step eliminates any residual warpage in the package and creates a flat bottom surface 175.

Figure 3D:
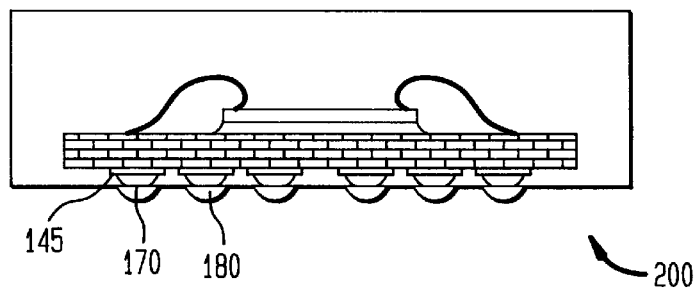

As shown in FIG. 3d, using conventional approaches, another array of solder balls 180 is connected to the exposed surfaces 170 of the first array of solder balls 145 (or metal bumps). Illustratively, the new solder balls 180 are made of 60/40 Pb/Sn having a melting point of less than or equal to 200° C. When reflowed, the new solder balls 180 properly wet the exposed bump areas 170 due to being of compatible material. In addition, fusion between the pair of solder balls 145, 180 (or between the metal bumps and solder balls 180) is excellent because they are of compatible material having similar metallizations. The resulting structure 200 shown in FIG. 3d is one embodiment of the present invention.

Figure 4:
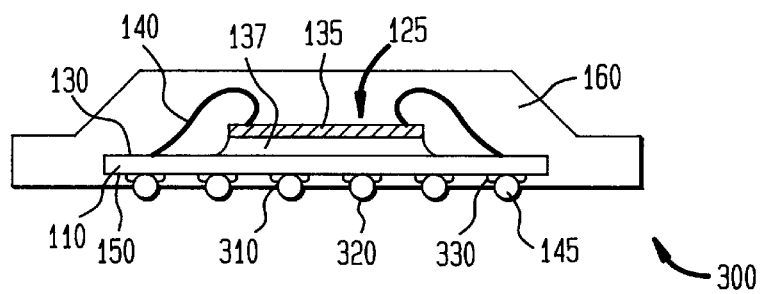
FIG. 4 is BGA package according to another embodiment of the invention.

FIG. 4 shows another embodiment 300 of the fully encapsulated, high reliability, planar BGA package. Because this embodiment 300 is also fully encapsulated, as in the previous embodiment 200 shown in FIG. 3d, similar advantages are achieved, such as reduced warpage. This is due to the stress on the top and bottom surfaces 130, 150 of the substrate 110 being balanced.

As shown in FIG. 4, the planar BGA package 300 comprises the die assembly 125 attached to the top surface 130 of the substrate 110. The IC chip (i.e. the die) 135 is mechanically connected by the die attach adhesive 137 to the top of the substrate 110. Bonding wires 140 electrically connect the die 135 to the substrate 110. The array of solder balls 145 (or metal bumps) have top portions 310 which are connected to the bottom surface 150 of the substrate 110 through the array of attach pads 142. The die assembly 125, substrate 110 and top portions 310 of the array of solder balls 145 (or metal bumps) are fully encapsulated in the mold compound matrix 160. Bottom portions 320 of the array of solder balls 145 (or metal bumps) extend outside the mold compound matrix 160.

Figure 5A:
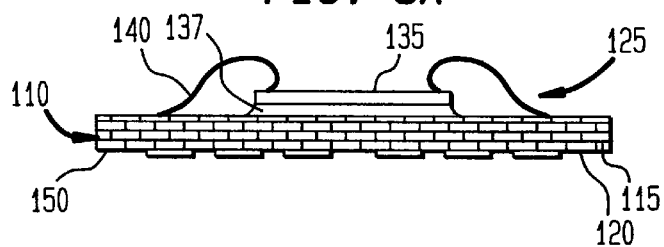
FIG. 5a–5e illustrate a process for forming the BGA package according to the embodiment of the invention shown in FIG. 4.

FIGS. 5a–5e show a method to form the planar BGA package 300 shown in FIG. 4. FIG. 5a shows a substrate 110 in which multiple layers of horizontal metal conductors 115 are embedded. The horizontal metal conductors 115 are selectively interconnected by the vertical conductors 120. The die 135 is mechanically attached to the substrate 110 by the die attach adhesive 137. The die 135 is electrically connected to the substrate 110 by bonding wires 140. The array of attach pads 142 is formed at the bottom surface 150 of the substrate 110 prior to full encapsulation. The area and thickness of each attach pad 142 depends on design specifications.

Figure 5B:
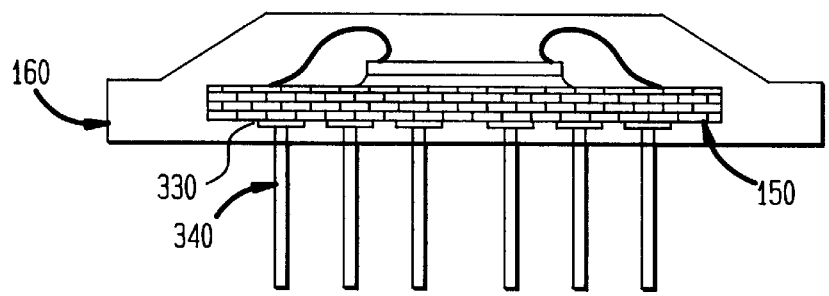

Unlike the previous embodiment shown in FIG. 3a, an array of solder balls are not formed on the array of attach pads 142. Instead, as shown in FIG. 5b, during the molding step, retracting pins 340 are positioned over the array of attach pads 142 to prevent the mold compound matrix 160 from fully covering the array of attach pads 142. Illustratively, the retracting pins 340 are cylindrical rods with a diameter of approximately 0.5 mm to 1.0 mm. Next, the substrate 110 with the attached die assembly 125, and portion of the retracting pins 340 are encapsulated fully in the mold compound matrix 160.

Figure 5C:
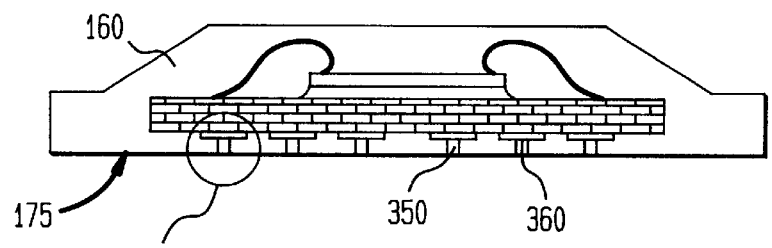
Figure 5D:
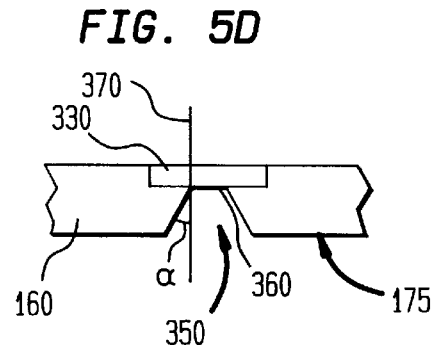
Figure 5E:
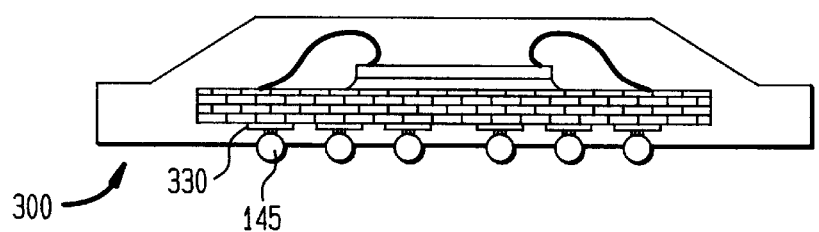

As shown in FIG. 5c, once the molding encapsulation process is completed, the retracting pins 340 are removed. This forms openings 350 by exposing a portion 360 of each attach pad 142 (of the array of attach pad 142) that was covered by the retracting pins 340. FIG. 5d shows the opening 350 in greater detail. The opening 350 may have a larger diameter near the bottom surface 175 of the mold compound matrix 160 than near the attach pads 142. Illustratively, the diameter of the opening 350 near the attach pads 142 is approximately equal to the diameter of the retracting pins 340, which is approximately 0.5 mm to 1.0 mm. The opening 350 is larger near the bottom surface 175 of the mold compound matrix 160. For example, is tapered to form an angle α of approximately 30° from a vertical axis 370. Next, as shown in FIG. 5e, an array of solder balls 145 (or metal bumps) is attached to the array of attach pads 142 through the openings 350 (FIG. 5c–5d) using conventional means.

This invention has many advantages. Fully encapsulating the BGA package significantly reduces resultant stresses on the substrate and therefore minimizes substrate warpage. This also eliminates the delaminations between the substrate and the mold compound which occur in conventional OMPAC BGA packages.

Thus, the inventive fully encapsulated BGA package minimizes the delamination/lifting-off of the edges at the substrate-to-mold compound interface as the substrate is embedded inside the mold compound matrix. This result is achieved because the mold compound encapsulant wraps around the substrate and shrinks as it is cooled to room temperature from the molding temperature of approximately 180° C. This creates a compressive stress on the substrate and ensures good adhesion.

Furthermore, moisture absorption is significantly diminished because the substrate is no longer exposed to the ambient. This improves reliability of the package. Lack of moisture absorption in the package eliminates debonding and package cracking problems encountered in conventional BGA packages.

In addition, the grinding step of the first embodiment ensures a flat surface at the I/O side of the substrate (i.e., the bottom surface 175 shown in FIG. 3c). This increases the yield of solder ball attachment process to the package. In the conventional approach, solder ball attachment poses a challenge due partly to the warped substrate.

Finally, the above described embodiments of the present invention are intended to be illustrative only. Numerous alternative methods, structures and embodiments may be devised by those skilled in the art without departing from the spirit and scope of the following claims.

We claim:

1. A grid array package comprising:
   a die attached to one surface of a substrate;
   connection ports arranged in a first array and attached to a surface of said substrate opposite to said one surface;
   a mold compound fully encapsulating said substrate, die and portions of said first array of connection ports, said mold compound covering said one surface of said substrate, and at least a portion of said substrate surface opposite to said one surface; and
   a second array of connection ports attached to exposed portions of said first array of connection ports.

2. The grid array package of claim 1, wherein said second array of connection ports is an array of solder balls.

3. The grid array package of claim 1, wherein said array of solder balls is 60/40 Pb/Sn solder.

4. The grid array package of claim 1, wherein said first array of connection ports comprises:
   an array of attach pads attached to said opposite surface of said substrate; and
   an initial array of connection ports attached to said array of attach pads.

5. A grid array package comprising:
   a die attached to one surface of a substrate;
   connection ports arranged in a first array and attached to a surface of said substrate opposite to said one surface;
   a mold compound fully encapsulating said substrate, die and portions of said first array of connection ports, said first array of connection ports comprising:
   an array of attach pads attached to said opposite surface of said substrate; and
   an initial array of connection ports attached to said array of attach pads, wherein said array of attach pads is an array of solder attach pads and said initial array of connection ports is an array of solder attach pads; and
   a second array of connection ports attached to exposed portions of said first array of connection ports.

6. The grid array package of claim 4, wherein said initial array of connection ports is an array of metal bumps.

7. The grid array package of claim 4, wherein said initial array of connection ports is an array of gold bumps.

8. The grid array package of claim 4, wherein said initial array of connection ports is an array of copper-gold alloy bumps.

9. The grid array package of claim 1, wherein said mold compound has a flat lower surface.

10. The grid array package of claim 1, wherein said mold compound is epoxy novolak based.

11. The grid array package of claim 1, wherein said substrate is Bismaleimide Triazine resin based.

12. The grid array package of claim 1, wherein said substrate is FR-4 material.

13. A grid array package comprising:
   a die attached to one surface of a substrate;
   an array of attach pads formed on a surface of said substrate opposite to said one surface;
   an array of connection ports attached to said array of attach pads; and
   a mold compound matrix fully encapsulating said substrate, die, array of attach pads and portions of said array of connection ports, said mold compound covering said one surface of said substrate, and at least a portion of said substrate surface opposite to said one surface.

14. The grid array package of claim 1, wherein said mold compound fully covers said one surface and each side surface adjacent to said one surface.

15. The grid array package of claim 13, wherein said mold compound matrix fully covers said one surface and covers each side surface adjacent to said one surface.

16. The grid array package of claim 5, wherein said mold compound covers said one surface of said substrate, and at least a portion of said substrate surface opposite to said one surface.

* * * * *